US010255967B1

(12) United States Patent
Venkata

(10) Patent No.: US 10,255,967 B1
(45) Date of Patent: Apr. 9, 2019

(54) POWER REDUCTION TECHNIQUE DURING WRITE BURSTS

(71) Applicant: Micron Technology, Inc., Boise, ID (US)

(72) Inventor: Harish N. Venkata, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/824,535

(22) Filed: Nov. 28, 2017

(51) Int. Cl.
*G11C 5/14* (2006.01)
*G11C 11/4093* (2006.01)
*G11C 7/10* (2006.01)
*G11C 16/30* (2006.01)
*G11C 29/02* (2006.01)
*G11C 11/56* (2006.01)

(52) U.S. Cl.
CPC .......... *G11C 11/4093* (2013.01); *G11C 5/147* (2013.01); *G11C 7/1075* (2013.01); *G11C 11/5628* (2013.01); *G11C 16/30* (2013.01); *G11C 29/023* (2013.01)

(58) Field of Classification Search
CPC ............ G11C 11/4093; G11C 11/5628; G11C 29/023; G11C 7/1075; G11C 5/147; G11C 16/30
USPC .................................................... 365/189.09
See application file for complete search history.

(56) References Cited

U.S. PATENT DOCUMENTS

| 6,067,264 A | * | 5/2000 | Kwon | G11C 7/1048 365/185.25 |
| 6,115,316 A | * | 9/2000 | Mori | G11C 7/06 365/189.09 |
| 2009/0231939 A1 | | 9/2009 | Hsu et al. | |
| 2012/0218837 A1 | | 8/2012 | Dimartino et al. | |
| 2014/0198594 A1 | | 7/2014 | McCombs | |
| 2015/0380064 A1 | | 12/2015 | McLaury | |
| 2017/0243637 A1 | | 8/2017 | Kulkarni et al. | |

OTHER PUBLICATIONS

PCT International Search Report & Written Opinion for PCT Application No. PCT/US2018/045844 dated Nov. 21, 2018; 14 Pages.

* cited by examiner

*Primary Examiner* — Tha-O H Bui
(74) *Attorney, Agent, or Firm* — Fletcher Yoder, P.C.

(57) ABSTRACT

A memory device may include voltage regulation circuitry configured to supply a voltage signal between a high signal and a low signal. The memory device may include a first data line configured to provide a first charge to the voltage regulation circuitry during a first mode of operation of the memory device. The memory device may include a second data line configured to draw a second charge from the voltage regulation circuitry to control a voltage on the second data line during a second mode of operation of the memory device.

20 Claims, 5 Drawing Sheets

| ELEMENT | VALUE TO BE READ/WRITTEN | CHARGE/DISCHARGE |
|---|---|---|
| RO LINE | 0 | RO REMAINS CHARGED AT VDD |
| RO LINE | 1 | DISCHARGED ONTO VDD/2 |
| WI LINE | 0 | CHARGED UP TO VDD/2 BY DSA WRITE DRIVER |
| WI LINE | 1 | DSA WRITE DRIVER OPERATES AT 0 |

FIG. 5

POWER REDUCTION TECHNIQUE DURING WRITE BURSTS

BACKGROUND

Field of the Present Disclosure

Embodiments of the present disclosure relate generally to the field of semiconductor devices. More specifically, embodiments of the present disclosure relate to systems and methods for performing read and write operations in error-correcting code (ECC) memory.

Description of Related Art

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Random access memory (RAM) device, such as a dynamic random-access memory (DRAM), may perform operations to fetch data from memory banks and write operations to store data into the memory banks. Certain RAM devices, such as synchronous dynamic RAM (SDRAM) devices may, for example, have multiple memory banks having many addressable memory elements. RAM devices may also have a communications interface that may receive addresses, instructions (e.g., read, write, etc.) for operations that may be associated with those addresses, and data associated with those instructions. Communications circuitry may process the data and addresses to access the corresponding memory banks. Communication lines, such as data transmission lines or paths, may be used to deliver data to the memory banks and to retrieve data from the memory banks. As storage in the memory banks increases to store more data, additional power may be utilized to access the memory banks. For example, as memory banks increase storage, additional communication lines may be added to the memory. However, the amount of power drawn by the DRAM during read and/or write operations may increase due to charging and discharging the communication lines to communicate data. Additionally, due to the additional communication lines, capacitance between the communication lines may increase power usage as well.

Embodiments of the present disclosure may be directed to one or more of the problems set forth above.

BRIEF DESCRIPTION OF DRAWINGS

FIG. 5 is a table that illustrates operation of the data path architecture of FIG. 2, according to an embodiment of the present disclosure.

DETAILED DESCRIPTION

Figure 1:
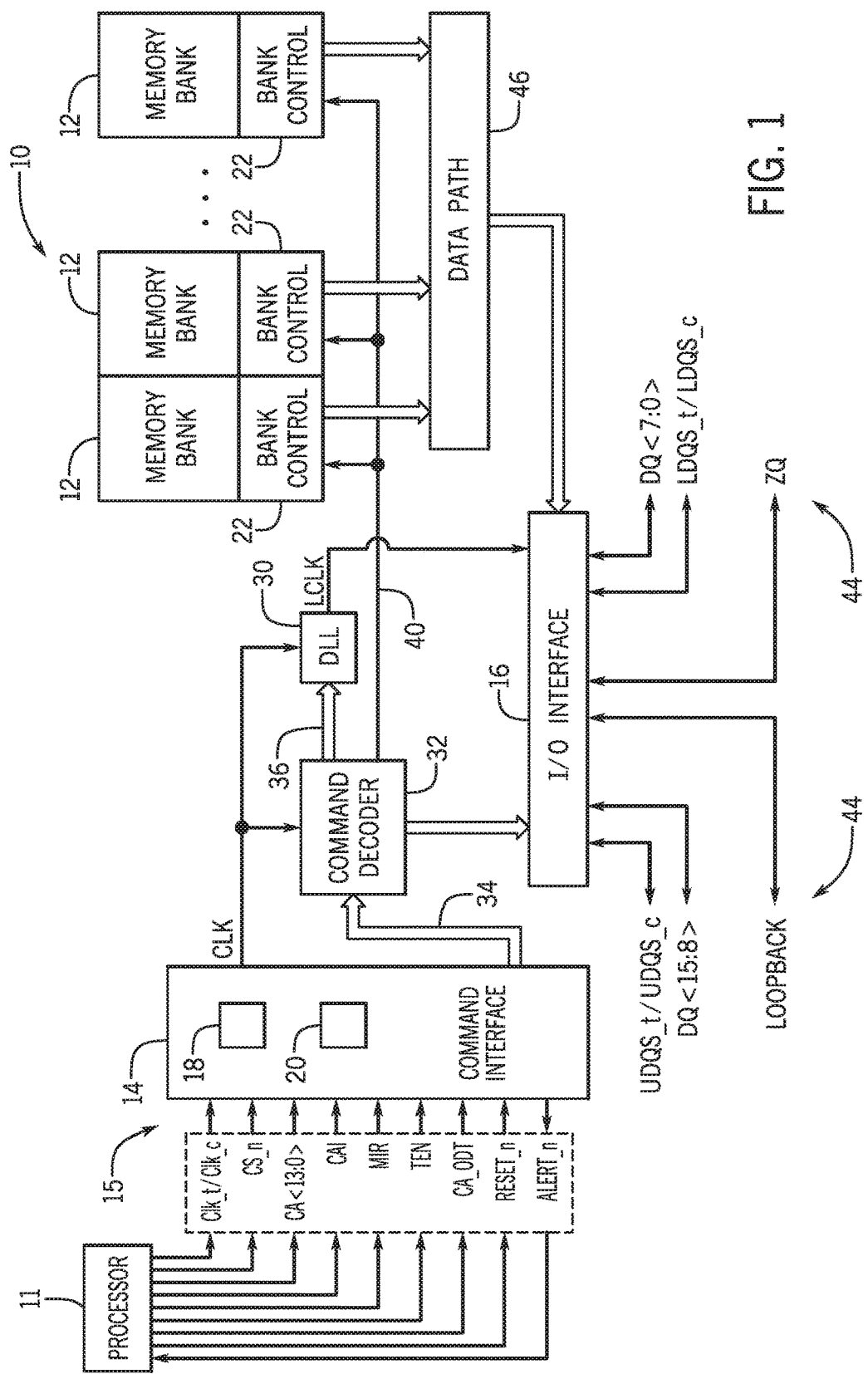
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A semiconductor memory device, such as double data rate type five synchronous dynamic random access memory (DDR5 SDRAM), may include several banks of memory that store data. Data lines, or main input/output (MIO) lines, may run between the memory banks and respective bank control circuitry at an end of each bank. As memory storage in each bank increases, the number of data lines may increase. Further, there may be capacitance due to the data lines being proximate to one another. As the number of data lines increase, additional power may be consumed to send and receive the data due charging and discharging on the additional data lines.

Further, to improve speed and/or quality of the memory, DDR5 SDRAM may include error-correcting code (ECC) circuitry on the die of the memory to fix variable retention time (VRT) and single bit errors (to improve early yield). During write commends, if external bits do not match required bits for an ECC encode, then an internal read command may be issued to fill in the remaining bits. For example, on DDR5 in some configurations, 64 bits may be provided externally while ECC performs a 128 encode. To fill in the remaining 64 bits, an internal read may be issued. That is, 64 bits may be read from memory and 64 bits may be provided internally to perform a 128 bit write. As another example, in data mask or burst chop operations, missing bits may be filled in by doing an internal read. As such, error-correcting code (ECC) memory may first perform a read operation to read the data and then perform a write operation. Each of the read operation and write operation may use power to communicate data along the data lines. Further, in DDR5, each read may fetch a certain number of bits from the array and average power draw can add up due to the number of bits.

As described below, to reduce power consumed, such as during the combined read and write operation with ECC memory on the die described above, a first data line may provide charge to voltage regulation circuitry during, for example, the read operation. Then, during the write operation, a second data line may draw charge from the voltage regulation circuitry to control the voltage on the second data line. By charging the voltage regulation circuitry and discharging using the power from the voltage regulation circuitry, less power may be consumed by the memory.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device, such as a processor 11 or controller. The processor 11 or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor 11. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor 11 or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor 11 or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor 11, such as a microprocessor, that controls the processing of system functions and requests in the host. Further, any host processor 11 may comprise a plurality of processors that share system control. The host processor 11 may be coupled directly or indirectly to additional system elements of the host, such that the host processor 11 controls the operation of the host by executing instructions that may be stored within the host or external to the host.

As discussed above, data may be written to and read from the memory device 10, for example, by the host whereby the memory device 10 operates as volatile memory, such as Double Data Rate DRAM (e.g., DDR5 SDRAM). The host may, in some embodiments, also include separate non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) as well as other types of memory devices (e.g., storage), such as solid state drives (SSD's), MultimediaMediaCards (MMC's), SecureDigital (SD) cards, CompactFlash (CF) cards, or any other suitable device. Further, it should be appreciated that the host may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices to allow a user to input data into the host, for example, buttons, switching elements, a keyboard, a light pen, a stylus, a mouse, and/or a voice recognition system, for instance. The host may optionally also include an output device, such as a display coupled to the processor 11 and a network interface device, such as a Network Interface Card (NIC), for interfacing with a network, such as the Internet. As will be appreciated, the host may include many other components, depending on the application of the host.

The host may operate to transfer data to the memory device 10 for storage and may read data from the memory device 10 to perform various operations at the host. Accordingly, to facilitate these data transmissions, in some embodiments, the I/O interface 16 may include a data transceiver 48 that operates to receive and transmit DQ signals to and from the I/O interface 16.

Figure 2:
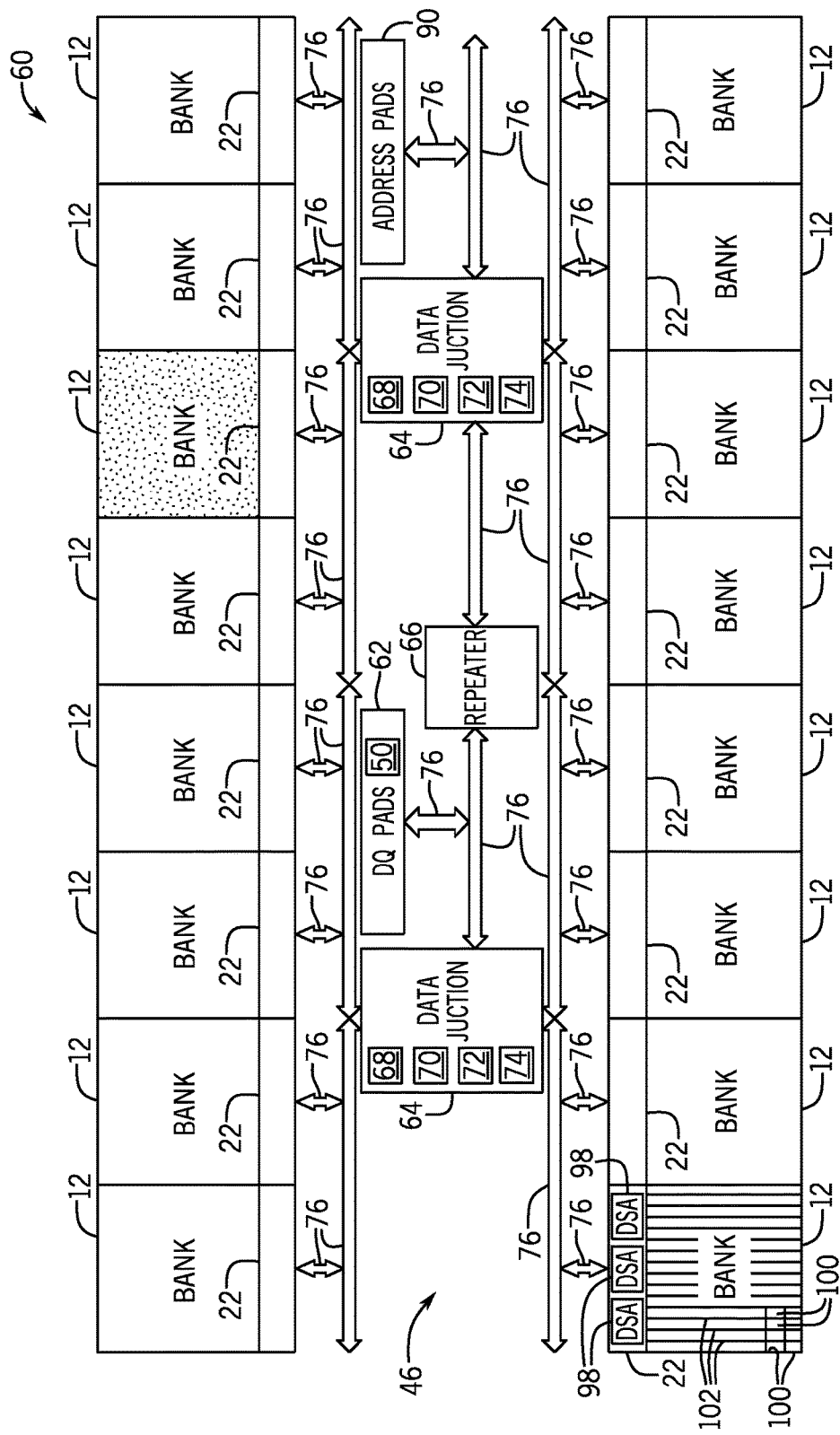
FIG. 2 is a block diagram illustrating an embodiment of a data path architecture suitable for lowering power consumption of the memory device shown in FIG. 1.

Turning now to FIG. 2, a block diagram illustrating an embodiment of a data path architecture 60 suitable for lowering power consumption of the memory device 10 is shown. Because the figure depicts like elements as those found in FIG. 1, the like elements are illustrated with like numbers. In the depicted embodiment, DQ pad(s) 62 may be used to communicate the IO signals (e.g., DQ<15:8> and DQ<7:0> shown in FIG. 1) to external devices, such as processors, field programmable arrays (FPGAs), and so on. The data communicated via the DQ pad(s) 62 may be converted by the one-hot communications interface 50 for transmittal or for receipt as one-hot signals through the data path 46. The DQ pads 62 may be included in the I/O interface 16 or communicatively connected to the I/O interface 16.

In the depicted embodiment, the data path 46 includes two data junctions 64 communicatively coupled to each other via a repeater 66. The data junctions 64 may channel data into/out of memory banks 12 during data transmission via the data path 46. Accordingly, each data junction 64 may include multiple systems, such as multiplexors 68, drivers 70, keepers 72, and other systems 74 as shown, suitable for data distribution. Additionally, address pads 90 may communicate via the communication lines 76. The repeater 66 may be used to span longer distances in a die, for example, by boosting signals to forward the data from one data junction 64 to another data junction 64. The communicated data may thus traverse through one or more communication lines 76 of the data path 46 into or out of the memory banks 12.

Further, each of the bank control blocks may include one or more data sense amplifiers (DSAs) and/or write driver circuitry 98 that receive and send signals to data storage circuitry 100 of the memory bank 12 via data lines 102, also referred to as main input/output (MIO) lines. The DSA and/or write diver circuitry 98 may receive signals from and send signals to data storage circuitry 100 of the memory banks 12 via the data lines 96. For example, during a read operation, data from the storage unit circuitry 100 may be retrieved and sent to the respective DSA and/or write driver circuitry 98. The DSA and/or write driver circuitry 98 may then provide the value via the communication lines 76. Further, during a write operation, data received by the DSA and/or write driver circuitry 98 from the communication lines 76 may be delivered to the desired storage unit 100 to store the data.

Various techniques may be used to communicate data to and from the memory bank 12 via the data lines 102. In some embodiments, a main input output (MIO) line and a main input output false (MIOF) line may be used to communicate data from local lines. One of the techniques used to communicate data via MIO lines is described with respect to FIG. 3.

Figure 3:
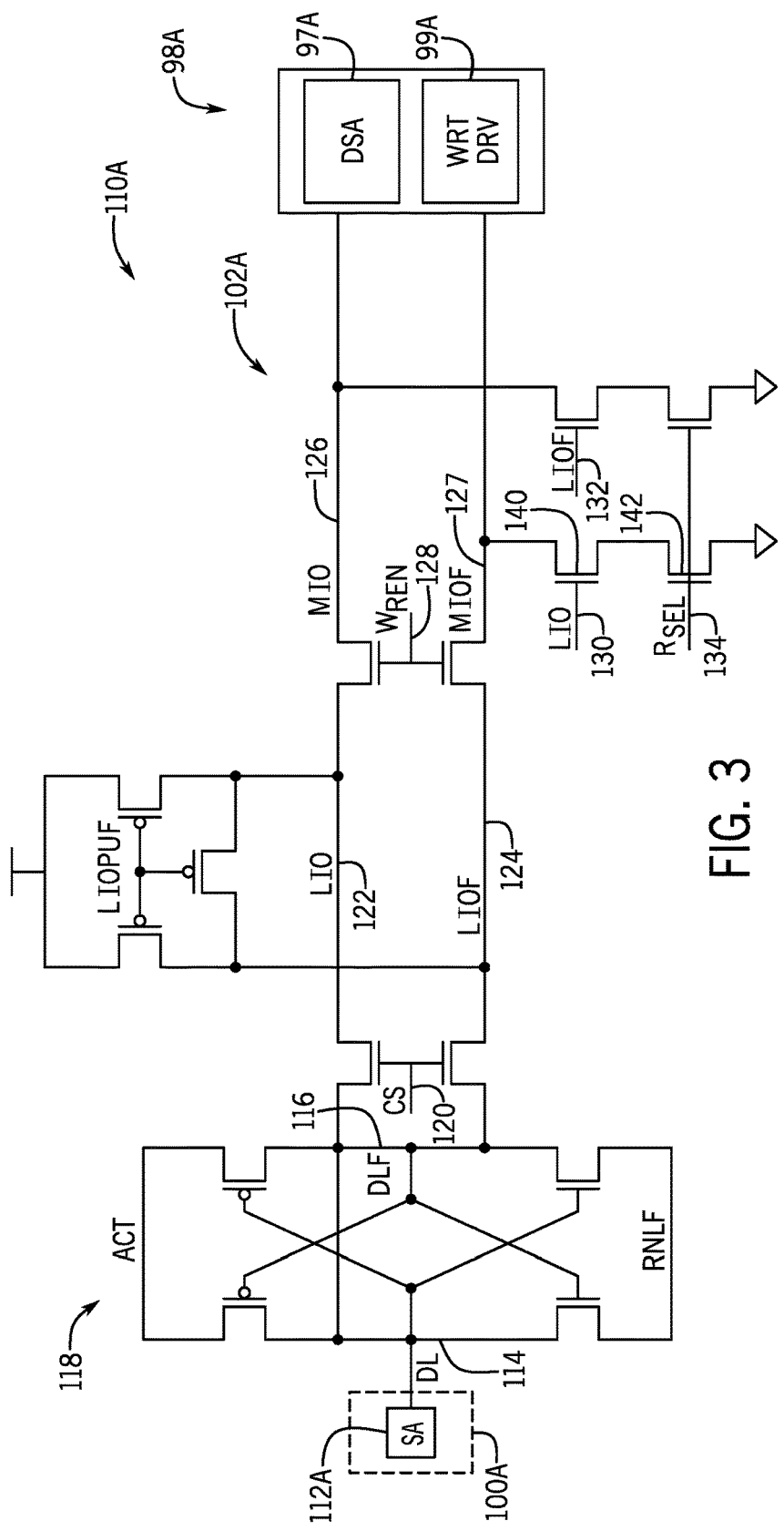
FIG. 3 is a circuit diagram illustrating certain features of the data path architecture of FIG. 2, according to an embodiment of the present disclosure.

FIG. 3 is a circuit diagram that shows a circuit topology 110A used to communicate between the memory banks 12 and the DSA and/or write driver circuitry 98A (an example of the DSA and/or write driver circuitry 98 from FIG. 2). The DSA and/or write driver circuitry 98A includes DSA 97A and write driver circuitry 99A. During a read operation, data from the data storage circuitry 100A (an example of the storage circuitry 100 of FIG. 2) of the memory bank 12 may be transferred onto digit line (DL) 114 via a sense amplifier 112A. Further, a complementary digit line false (DLF) 116 may be generated via the complementary circuitry 118 based on a voltage on the DL 114. In this example read operation, MIO line 126 and MIOF line 127 are precharged to a HIGH state via the DSA 98A. For example, the MIO line 126 and MIOF line 127 may be charged to have a voltage of approximately 1.1V, 1.2V, or another preset voltage with respect to ground. Further, the LIO and LIOF lines may also be precharged to a HIGH state.

When reading a HIGH value (e.g., a stored one value), LIO line 122 is charged HIGH and LIOF line 124 is LOW (e.g., 0V or 300 mV) via the DL 114 and the DLF 116. The read select 134 is turned on and the transistors 140 and 142 are turned on and the MIOF line 127 signal is pulled LOW. The DSA 97A may then detect the HIGH state of the MIO line 126 and/or the LOW state of the MIOF line 127 and send the data via the communication lines 76. Similarly, when reading a LOW value (e.g., a stored 0 value), the LIOF line 124 is charged HIGH and the LIO line 122 is driven LOW via charges of the DL 114 and DLF 116. That is, turning the read select 134 on and closing the read select transistor 142 causes the voltage on the MIO line 126 to be based on the charge of the LIO line 122 and the voltage on the MIOF line 127 to be based on the charge of the LIOF line 124.

Further, in this embodiment, each read causes both the MIO line 126 and the MIOF line 127 to be precharged HIGH, and charge of at least one of the MIO line 126 and MIOF line 127 is discharged to ground to be LOW. During the write operation, one of the MIO line 126 and the MIOF line 127 is precharged to HIGH, further increasing the power consumption. Because some write operations may include a read operation prior to the write operation, each read and/or write operation may cause some charge from the MIO line 126 and the MIOF line 127, referred to generally as the data lines 102, to be discharged to ground. Further, the voltage swings in the illustrated embodiment may be between HIGH and LOW voltages.

During read operations, the amount of read current consumed may be based on the following relationship:

$$\text{Read current } Rd(i) = C * \frac{dV}{dt} \qquad (1)$$

where C is the data line capacitance times the number of bits, dV is a small swing in voltage (e.g., from LOW to ground), and dt is an amount of time between accessing data from a selected bank group and accessing data again from the same bank group (tCCDL). Similarly, the relationship of the current consumed during a write operation may be:

$$\text{Write current } Wr(i) = C * \frac{dV}{dt} \qquad (2)$$

where C is the data line capacitance times the number of bits, dV is a full swing in voltage (e.g., from HIGH to LOW or from LOW to HIGH), and dt is an amount of time between writes from the same bank group (tCCDL).

The read and write operations may draw an average total amount of current described below:

$$\text{Total average} = Rd(i) + Wr(i) \quad (3)$$

As an example in which IO capacitance is approximately 700 fF with 256 bits, a small swing voltage of 200 mV, a full swing voltage of 1.1V, and a tCCDL of 5 ns may result in the following estimate:

$$\text{Total avreage}(i) = \quad (4)$$
$$700 \ fF * 256 * \frac{.2}{5 \ \text{ns}} + 700 \ fF * 256 * \frac{1.1 \ v}{5 \ \text{ns}} = 46.6 \ \text{mA}$$

These numbers are meant to be illustrative in conjunction with the embodiments described below, and any suitable capacitance, bits, voltages, and tCCDL may be used.

As the number of memory banks and/or the number of storage units 100 increase, the number of data lines 102, and the amount of data communicated, may be increased. For example, doubling the storage in each of the memory banks may double the number of data lines 102. However, the increased number of data lines 102 may increase power usage when communicating data. Additionally, parasitic capacitance between data lines 102 may increase due to the data lines 102 being placed in closer proximity to one another, causing additional power losses. As such, systems and methods to reduce the amount of power consumed by the data lines 102 is desired.

Further, as mentioned above, memory with ECC circuitry on the die may perform combined read and write operations. Additionally, during read operations, a set number of bits may be read and power draw may add up do to reading the set number of bits. For instance, when writing 64 bits received externally during a 128 bit encode, 128 bits may be read from memory, and 64 of the 128 bits read may be written back into memory along with the 64 bits received externally.

As described below, in another embodiment, the data lines 102 may utilize voltage regulation circuitry that supplies power between the HIGH and LOW states. A first data line may provide charge to the voltage regulation circuitry to reduce the charge on the first IO line during a first operation. A second data line may draw the charge stored on the voltage regulation circuitry, for example, from the first operation, to charge the second IO line during a second operation. Further, the first data line may operate across a voltage range between the HIGH state and the voltage of the voltage regulation circuitry. The second data line may operate across a voltage range between the voltage of the voltage regulation circuitry and the LOW state. For example, if the voltage regulation circuitry supplies a voltage at approximately a midpoint between the HIGH and LOW states, referred to below as $V_{DD}/2$ (e.g., a MEDIUM state), for instance, with HIGH being VDD and LOW being ground, then the voltage swings of each of the first data line and the second data line may be approximately half compared to the above embodiment. As such, memory with ECC circuitry on the die may have reduced power consumption by using charge stored during a read as power delivered during a write.

Figure 4:
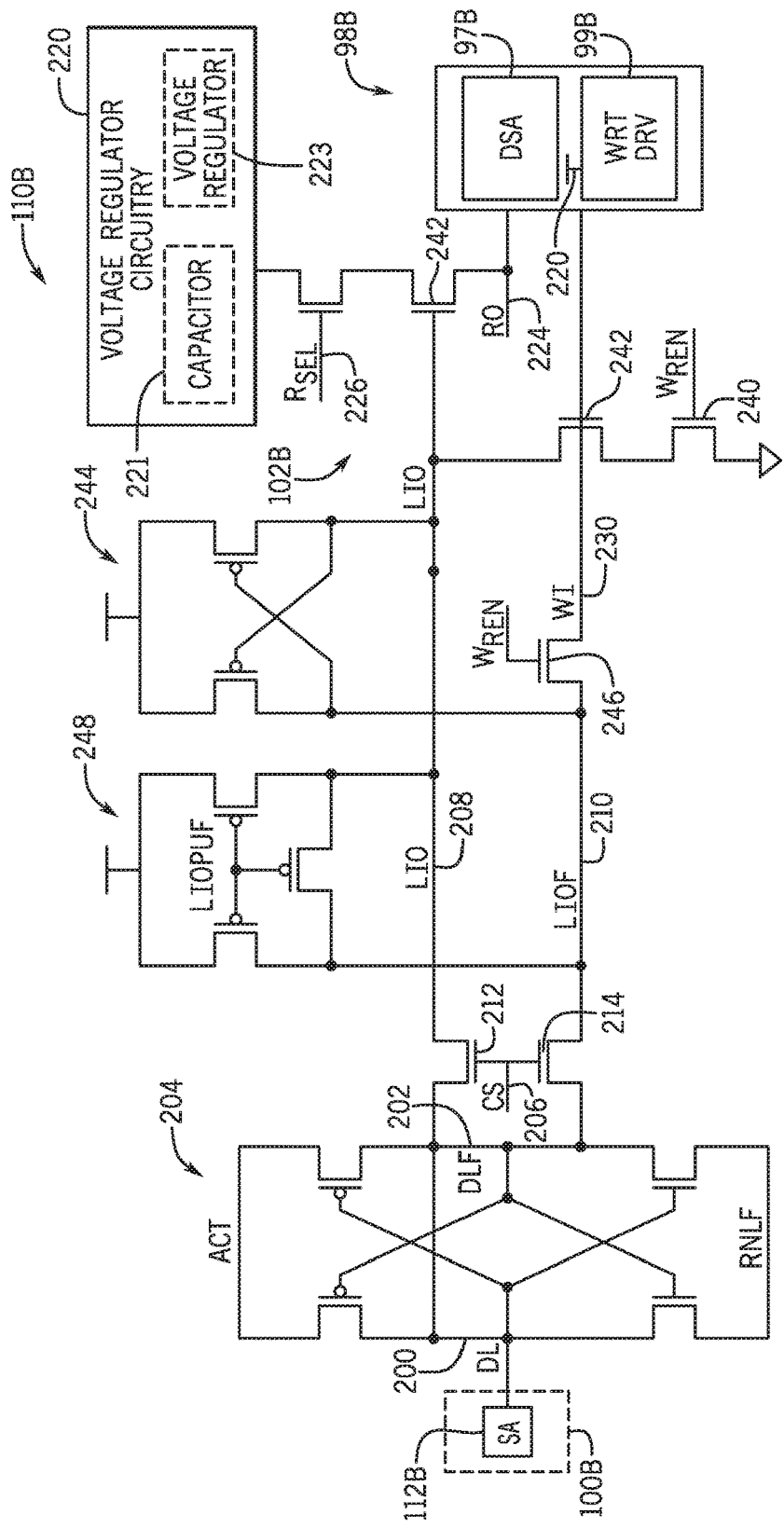
FIG. 4 is a circuit diagram illustrating certain features of the data path architecture of FIG. 2, according to an embodiment of the present disclosure.

FIG. 4 is a circuit diagram that shows the circuit topology 110B to communicate data between another example of the data storage circuitry 100 and the DSA and/or write driver circuitry 98 of FIG. 2, referred to below as data storage circuitry 100B and DSA 97B and Write Driver 99B respectively. The data from the data storage circuitry 100B may be transferred to the digit line (DL) 200 via the sense amplifier 112B. Further, a complementary digit line false (DLF) 202 may be generated via the crossing circuitry 204. A local input/output (LIO) line 208 and a complementary local input/output false (LIOF) line 210 may be electrically coupled to the DL 200 and the DLF 202 via transistors 212 and 214 from a column select 206 signal. That is, when the desired column is selected to perform a read operation, the LIO line 208 may be charged to a voltage based on the DL 200 via the transistor 212, and the LIOF line 210 may be charged to a voltage based on the DLF 202 via the transistor 214.

As mentioned above, it is desirable to reduce the amount of power consumed during memory read and write operations. The circuit topology 110B includes voltage regulation circuitry 220 (e.g., a voltage supply) that supplies a voltage signal between a HIGH (e.g., 1.1V, 1.2V, etc.) voltage signal and a LOW (e.g., 300 mV, 100 mV, 0V, etc.) voltage signal. In the illustrated embodiment, the voltage regulation circuitry 220 $V_{DD}/2$ is half of, for example, a 1.2V signal, or approximately 0.6V. While certain voltages are described as an example with respect to the illustrated embodiment, these are meant to be examples, and any suitable voltages may be used.

Similar to the MIO line 126 described with respect to FIG. 3, the DSA 97B may pre-charge a read output (RO) line 224 to a HIGH state. When the read select (Rsel) line 226 is HIGH, the HIGH charge on the RO line 224 may be provided (e.g., dumped) to the voltage regulation circuitry 220. The voltage regulation circuitry 220 may include one or more capacitors 221 and/or voltage regulators 223. In some embodiments, the one or more capacitors 221 may store the charge delivered from the RO line 224, and the one or more voltage regulators 223 may regulate the voltage on the voltage regulation circuitry 220 to be between a lower voltage and a higher voltage to maintain a voltage approximately (e.g., within 1 mV, 5 mV, 10 mV, 100 mV, 200 mV, etc.) at $V_{DD}/2$. The RO line 224 may operate between the HIGH charge and $V_{DD}/2$ during read operations. That is, the RO line 224 may swing half way instead of the full swings during read operations described with respect to FIG. 3.

During read operations, the DSA 97B may compare voltages received and determine whether the received voltage represents a HIGH signal or a $V_{DD}/2$ signal. The DSA 97B may then output a HIGH signal based on receiving the HIGH signal, or the DSA 97B may output a LOW signal based on receiving the $V_{DD}/2$ signal. The communication lines 76 may then receive the desired HIGH or LOW signal while reducing power consumed by the data lines 102 of the memory bank. During write operations, signals may be received from the communication lines 76 and the DSA and/or Write Driver circuitry 98B may output the desired charge onto the write input line via the voltage regulation circuitry 220. Although schematically shown with voltage regulation circuitry 220 coupled to the read output line 224 separate from voltage regulation circuitry 220 of the write driver 99B, the voltage regulation circuitry 220 may be electrically coupled to one another to allow the voltage regulation circuitry to both store charge via the read output line 224 and to provide the stored charge to the write input line 230. That is, a first charge may be delivered to the capacitor 221 of voltage regulation circuitry 220 via the read output line 224 as shown by the connection to the read output line 224, and a second charge from the capacitor 221 may be delivered to the write input line 230 from the voltage regulation circuitry 220 as shown by the connection within the DSA and/or write driver circuitry 98B. The second charge delivered to the write input line 230 may be based on (e.g., partially charged from or powered by) the first charge from the read output line 224 to the voltage regulation circuitry 220. By storing charge from the read output line 224 into a capacitor 221 of the voltage regulation circuitry 220 and providing charge from the capacitor 221 of the voltage regulation circuitry 220 to the write input line 230, power may be better conserved as compared to embodiments that dump charge to ground during both read and write.

During write operations, the write input (WI) line 230 may draw charge from the voltage regulation circuitry 220 to output for example, $V_{DD}/2$ or ground depending on the value to be stored in the storage circuitry 100B. That is, the WI line 230 may swing between ground or $V_{DD}/2$ to indicate a value to be stored in the memory bank 12. For example, a WI line 230 voltage being charged to $V_{DD}/2$ (e.g., 0.55V) may indicate a HIGH value to be stored in the memory bank 12, and a WI line 230 voltage of ground may indicate a LOW value to be stored in the memory bank 12.

By dumping charge during read outputs when the LIO line 208 and the Rsel line 226 are HIGH, the dumped charge may be used during the write operation when the WI line 230 is charged to $V_{DD}/2$. Further, even if the charge of the RO line 224 is dumped and the WI line 230 is repeatedly set to ground, less current may be used as compared to embodiments described with respect to FIG. 3. For example, current drawn during a read operation may include:

$$\text{Read current } Rd(i) = C * \frac{dV}{dt} \quad (5)$$

where C is the capacitance of the data lines 102 times the number of bits, dV is a small voltage swing, and dt is tCCDL. Further, during write operations:

$$\text{Write current } Wr(i) = C * \frac{dV}{dt} \quad (6)$$

in which C is the capacitance across the data lines 102A times the number of bits, dv is $V_{DD}/2$ during a full swing, and dt is an amount of time between reading/writing from a (tCCDL). To determine the total average current the following equation may be used:

$$\text{Total average}(i) = \text{MAX}[Rd(i), Wr(i)] \quad (7)$$

That is, in the example above, the write operation may use the power stored from the read operation so that the current consumed is the max of each of the operations. Using the example numbers described above, the total average current of the read and write operations may be:

$$\text{Total average}(i) = \text{MAX}\left(700 \ fF * 256 * \frac{.2 \text{ v}}{5 \text{ ns}}, \quad (8)\right.$$
$$\left. 700 \ fF * 256 * \frac{.55 \text{ v}}{5 \text{ ns}}\right)$$
$$= \text{MAX}(7.1 \text{ mA}, 19.7 \text{ mA})$$

As such, the total average current consumed is approximately 19.7 mA in the illustrated embodiment of FIG. 4 using similar sample numbers as were described with respect to FIG. 3, thus resulting in a reduced power consumed during read and write operations.

Due to the half swings of voltages from including the $V_{DD}/2$, the WI line 230 may operate between $V_{DD}/2$ and 0V. If the WI line 230 is operating at the HIGH state, the LIO line 208 is driven to the LOW state via the closing of the transistors 240 and 242. The complementary circuitry 244 may drive the LIOF line 210 to be the complementary signal to LIO line 208. For example, when LIO is in the LOW state, the complementary circuitry 244 may drive the LIOF line 210 to be in the HIGH state. Similar to the example with respect to FIG. 3, the complementary circuitry 204 may drive the DL 200 and DLF 202 to be complementary signals as well.

FIG. 5 is a logic table 264 that illustrates the operation of the RO line 224 and the WI line 230 in conjunction with the values to read/write. In row 268, a value of zero is being read from the memory bank 12. In this example, LIO is set to the LOW state. Further, as mentioned above, the RO line is precharged to the HIGH state. Because the switch 242 does not switch, the RO line may remain charged in the HIGH state and the DSA 97B may sense the HIGH state and output a zero value as being read. In row 270, the LIO is set to the HIGH state and the RO line is precharged to the HIGH state. Because the LIO is set to the HIGH state, the transistor 242 may close and the transistor of the read select 226 may close causing the RO to dump charge onto the voltage regulation circuitry 220. The DSA 97B may sense the $V_{DD}/2$ charge and output a one value as being read. In row 272, the write driver 99B may output a voltage of $V_{DD}/2$ onto the WI line 230 to write a zero. During the write, the transistor for the write enable line may close and because the WI line 230 has a voltage of VDD/2, the transistor 242 may close causing the LIO line 208 to be reduced to ground to result in a zero value being stored. In row 274, the write driver 99B may maintain the WI line 230 in the LOW state. Upon the write enable transistor 244 closing, the WI line 230 may control the LIOF line 210 to be in a LOW state. The complementary circuitry 248 may control the LIO line 208 to the HIGH state to be opposite of the LOW state of the LIOF line 210 and to cause a one to be written into the memory bank 12.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:
1. A memory device comprising:
voltage regulation circuitry configured to supply a voltage signal between a HIGH signal and a LOW signal;

a first data line configured to provide a first charge to the voltage regulation circuitry during a first mode of operation of the memory device, wherein the voltage regulation circuitry is configured to generate the voltage signal based on the first charge; and a second data line configured to draw a second charge from the voltage signal supplied from the voltage regulation circuitry to control a voltage on the second data line during a second mode of operation of the memory device.

2. The memory device of claim 1, comprising:
a memory bank comprising the voltage regulation circuitry, the first data line, the second data line, and at least one data sense amplifier (DSA) configured to sense a voltage on the first data line, wherein the first data line and the second data line are electrically coupled between the memory bank and the data sense amplifier.

3. The memory device of claim 1, wherein the first data line comprises a read output line to transmit data from memory of the memory device, wherein the second data line comprises a write input line configured to transmit data into the memory.

4. The memory device of claim 1, wherein the voltage regulation circuitry comprises a capacitor and a voltage regulator, wherein the capacitor is configured to store the first charge received from the first data line and to provide the second charge to the second data line to allow the second data line to control the voltage on the second data line, and wherein the voltage regulator is configured to maintain a voltage level of the voltage signal of the voltage regulation circuitry.

5. The memory device of claim 4, wherein the voltage regulator is configured to maintain the voltage level of the voltage signal of the voltage regulation circuitry between a minimum voltage and a maximum voltage.

6. The memory device of claim 1, wherein the first mode of operation comprises performing a read from memory of the memory device.

7. The memory device of claim 1, wherein the second mode of operation comprises performing a write into memory of the memory device.

8. The memory device of claim 1, wherein the first data line is configured to remain charged to indicate a zero value of the memory device and to provide charge to the voltage regulation circuitry to indicate a one value of the memory device.

9. The memory device of claim 1, wherein the second data line is configured to be charged via the voltage signal of the voltage regulation circuitry to indicate a zero value to be written into the memory device, and wherein the second data line is configured to provide the LOW signal to indicate a one value to be written into memory of the memory device.

10. A system, comprising:
a processor;
one or more memory devices coupled to the processor, each comprising:
a memory bank comprising memory storage circuitry;
a data sense amplifier write driver;
voltage regulation circuitry configured to supply a voltage signal between a HIGH signal and a LOW signal;
a first data line coupled to the data sense amplifier write driver, wherein the first data line is configured to provide a first charge to the voltage regulation circuitry during a first mode of operation, wherein the voltage regulation circuitry is configured to generate the voltage signal based on the first charge; and a second data line coupled to the data sense amplifier write driver, wherein the second data line is configured to draw a second charge from the voltage signal supplied from the voltage regulation circuitry to control the voltage on the second data line during a second mode of operation.

11. The system of claim 10, comprising a local input output (LIO) line, wherein the LIO line is configured to control operation of a transistor of the memory bank to cause the first data line to provide the first charge to the voltage regulation circuitry.

12. The system of claim 10, wherein the data sense amplifier write driver is configured to control the voltage on the second data line to operate a transistor of the memory bank to control the voltage of a local input output (LIO) line.

13. The system of claim 10, comprising a local input output (LIO) line and a local input output false (LIOF) line, complementary to the LIO line.

14. The system of claim 13, comprising a digit line (DL) line and a digit line false (DLF) line, wherein the storage circuitry is configured to receive and send data via connections to the DL line and the DLF line, and wherein the DL line and the DLF line are configured to receive and send data via the LIO line and the LIOF line upon receiving a column select signal.

15. The system of claim 14, wherein the one or more memory devices comprise error-correcting code (ECC) circuitry on a die of the memory device.

16. A method, comprising:
charging a first data line of a memory bank to be in a HIGH state;
during a read operation, providing a first charge from the first data line to voltage regulation circuitry to store the first charge from the first data line at the voltage regulation circuitry and to control a value read from the memory bank; and
during a write operation, providing a second charge to a second data line of the memory bank based at least in part on the first charge stored at the voltage regulation circuitry to control the value stored during the write operation.

17. The method of claim 16, comprising:
providing the first charge to the first data line to control the first data line to be in either the HIGH state or at a MEDIUM state, between the HIGH state and a LOW state; and
providing the second charge to the second data line to control the second data line to be in either the MEDIUM state or the LOW state.

18. The method of claim 16, comprising controlling operation of a local input output (LIO) line based on the second charge of the second data line.

19. The method of claim 16, wherein the voltage regulation circuitry is configured to store the first charge from the first data line via a capacitor of the voltage regulation circuitry and to provide the second charge to the second data line via the first charge on the capacitor.

20. The method of claim 16, comprising controlling operation of a transistor of the memory bank via charge of a local input output (LIO) to control operation of the first data line.

* * * * *